United States Patent [19]

Kropielnicki et al.

[11] Patent Number: 4,654,669

[45] Date of Patent: Mar. 31, 1987

[54] ELECTRICAL SIGNAL SEPARATING DEVICE FOR WINDOW ANTENNA HAVING ISOLATING AND MATCHING CIRCUITRY

[75] Inventors: Jerzy J. Kropielnicki, Knutsford, England; Brian Easter, Llangefni; James D. Last, Llanfairfechan, both of United Kingdom

[73] Assignee: BSH Electronics, Ltd., Manchester, England

[21] Appl. No.: 563,513

[22] Filed: Dec. 20, 1983

[51] Int. Cl.⁴ .................... H01Q 1/02; H01Q 1/32
[52] U.S. Cl. .................................. 343/704; 343/861; 343/713; 455/291
[58] Field of Search ............... 343/704, 712, 713, 861; 455/280, 286, 291

[56] References Cited

U.S. PATENT DOCUMENTS

| | | | |
|---|---|---|---|
| 2,042,319 | 5/1936 | Lindenblad | 343/704 |
| 3,484,584 | 12/1969 | Shaw | 343/704 |
| 3,725,942 | 4/1973 | Ukmar | 343/745 |
| 4,086,594 | 4/1978 | Kropielnicki et al. | 343/704 |
| 4,439,771 | 3/1984 | Kume et al. | 343/704 |

FOREIGN PATENT DOCUMENTS

| | | | |
|---|---|---|---|
| 2735278 | 2/1978 | Fed. Rep. of Germany | 343/704 |
| 2746419 | 5/1978 | Fed. Rep. of Germany | 343/704 |

OTHER PUBLICATIONS

"Amplified Car Radio Antennas" by Gary K. Johnson, Radio-Electronics, May 1972, pp. 37-39, 78-79, 88-89, and 91.

Primary Examiner—E. Lieberman
Attorney, Agent, or Firm—Shoemaker and Mattare, Ltd.

[57] ABSTRACT

The present invention provides within three particular aspects thereof an isolating and matching device operable to enable an electrically heatable window of a motor vehicle to be used as an efficient VHF communications aerial or antenna; wherein isolating and matching circuitry is provided for Series VHF Matching, Shunt VHF Matching and Split Passband Matching of an electrically heatable window heating element to an aerial input impedance of an aerial feeder circuit of a radio frequency receiver or transmit/receiver device.

18 Claims, 5 Drawing Figures

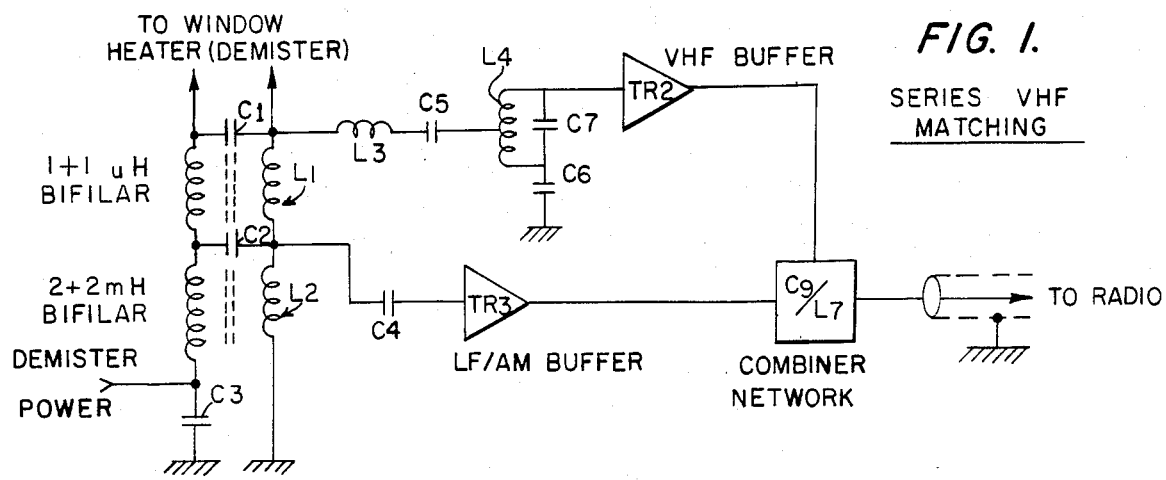
FIG. 1. SERIES VHF MATCHING
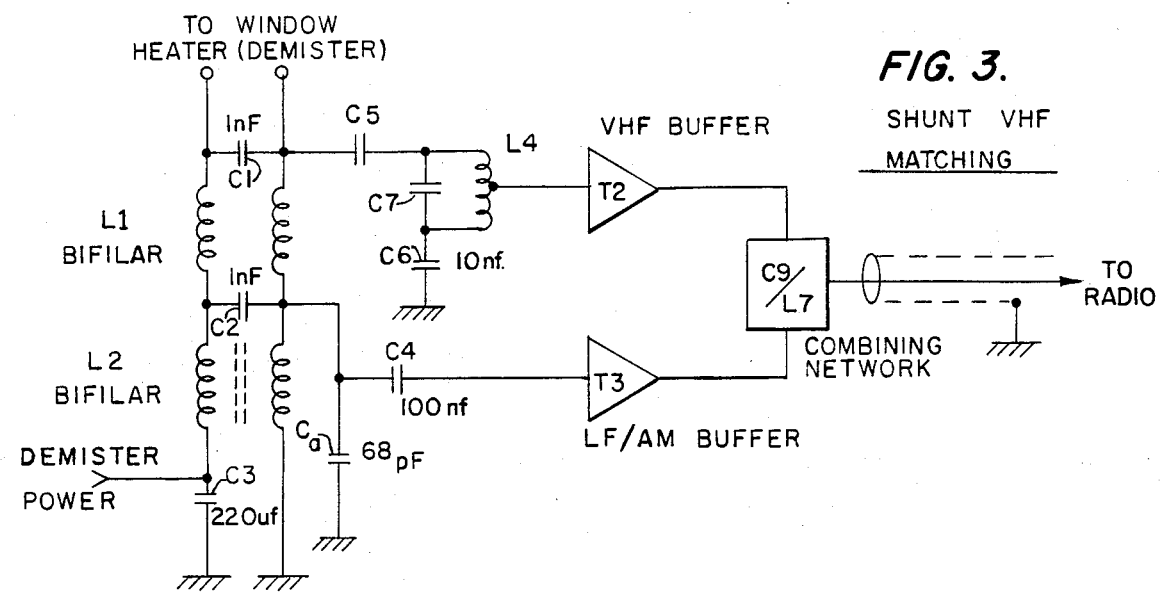
FIG. 3. SHUNT VHF MATCHING
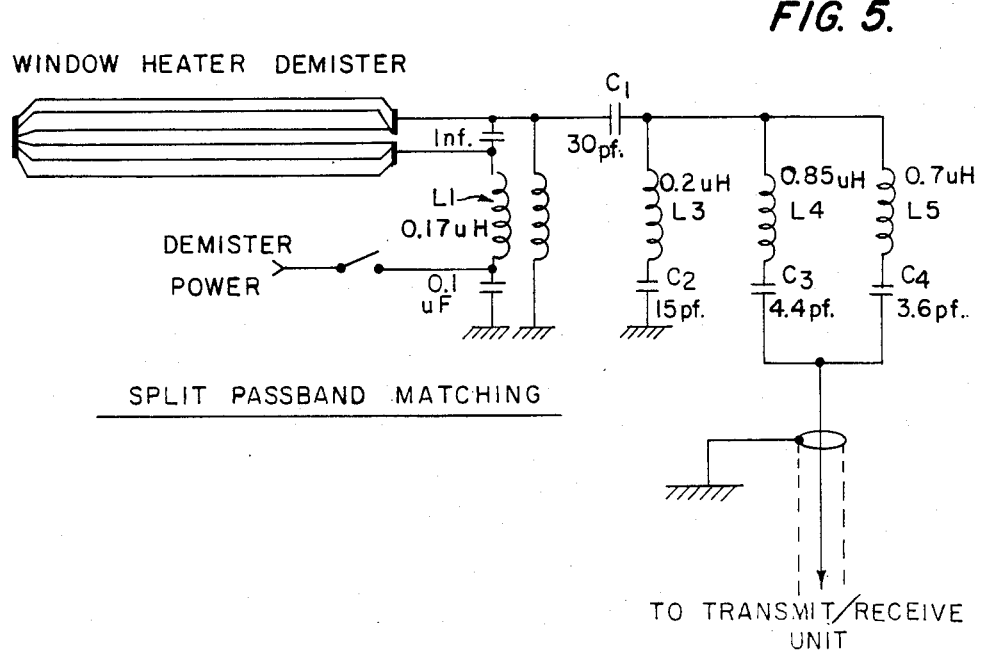
FIG. 5. SPLIT PASSBAND MATCHING

ELECTRICAL SIGNAL SEPARATING DEVICE FOR WINDOW ANTENNA HAVING ISOLATING AND MATCHING CIRCUITRY

BACKGROUND OF THE INVENTION

This invention relates to the field of electrical signal separating devices or isolating and matching devices which are utilized to enable a heating element means of an electrically heatable window, i.e., a motor vehicle heated rear window (defroster) unit not designed specifically to be an antenna or aerial and essentially aperiodic and nonresonant at RF frequencies, to be used as an efficient radio frequency transmitting or receiving aerial, while the window unit is used simultaneously for a heating (demisting) purpose.

The electrical signal separating function of these devices is used for separating a radio signal from the heating element of an electrically heated window when the same is enabled to be used as a radio aerial.

Kropielnicki U.S. Pat. No. 4,086,594 discloses a device in the field of the present invention and provides an electrical signal separating device for separating a radio signal from the resistance heating element of an electrically heated window, and includes the usage of an isolating or blocking circuit which comprises a bifilar coil means arranged so as to provide high impedance paths for in-phase fluctuating currents but low resistance paths for currents flowing from a motor vehicle D.C. power supply, whereby the bifilar coil arrangement effectively blocks the radio frequency signals while passing the current from the D.C. power supply to the heating element, such referenced device being used to enable a heated rear window of a motor vehicle to be used as a receiving radio aerial and for heating purposes.

Another device in the field of the present invention is Kropielnicki U.S. application Ser. No. 359,304, filed Mar. 18, 1982, which will issue as U.S. Pat. No. 4,422,077 on Dec. 20, 1983, the disclosure of which provides an improvement of the above-referenced prior Kropielnicki U.S. patent.

Such improvement relates to enabling the use of a motor vehicle electrically heated window as a transmitting or receiving aerial at AM or VHF/FM wavelengths, and includes matching and tuning circuitry being operative to effectively match the impedance of the window heating element to an aerial feeder circuit of a transmitter so that efficient VHF transmission, from the motor vehicle electrically heated window of signals received at an aerial input terminal, is effected; this disclosed improvement further incorporating, in combination, isolating circuitry comprising a bifilar coil means.

The present invention provides further advantageous and improved embodiments in this field of invention and further provides specific improvements of the devices disclosed in the above-referenced U.S. patents, which improvements pertain, in particular, to improved isolating and/or matching circuitry embodiments which have significant advantages over the prior art recited hereinabove.

BRIEF DESCRIPTION OF THE INVENTION

In accordance with the present invention, novel isolating and matching devices are provided to enable a heating element of a motor vehicle electrically heatable window, not designed specifically to be an antenna or aerial and essentially aperiodic and non-resonant at RF frequencies, to be used as either an efficient receiving aerial or a transmitting aerial in the VHF band.

More specifically, the present invention provides specific improved embodiments which are defined and distinctly set forth hereinafter as VHF matching devices of a series, shunt, or split passband kind or type.

Accordingly, in a first aspect of the invention, a Series VHF Matching embodiment is provided wherein the matching circuitry thereof includes input circuit means, operatively connected with isolating circuitry and said heating element, which is operable to bring the heating element to series resonance near the center of the VHF band; whereby, via this disclosed isolating and matching device, the motor vehicle electrically heatable window forms together with such input circuit means a series resonance in the VHF band and becomes usable as an efficient VHF receiving aerial. Further provided in such matching circuitry is a parallel resonant circuit means directly coupled with such input circuit means to form therewith a near-optimum matching circuit.

A second aspect of the invention is provided by a Shunt VHF Matching embodiment, which includes matching circuitry having an input circuit means operatively connected with isolating circuitry and the heating element of a motor vehicle electrically heatable window and is operable with an inductance of the isolating circuitry to bring the heating element to resonance near the center of the VHF band; whereby, via such isolating and matching device, a motor vehicle electrically heatable window forms together with such input circuit means a parallel resonant means in the VHF band and becomes usable as an efficient VHF receiving aerial. Further included in such matching circuitry is a parallel resonant circuit means operable with the beforementioned input circuit means and isolating circuitry and heating element to form therewith a VHF broad-band matching characteristic circuit.

A third aspect of the invention provides a Split Passband Matching embodiment, which affords an isolating and matching device having circuit means for providing two VHF passbands, one centered on a predetermined VHF transmit frequency and the other centered on a predetermined VHF receive frequency; whereby, via such isolating and matching device, a motor vehicle electrically heatable window becomes usable as an efficient VHF transmitting and/or receiving aerial. In this embodiment, isolating circuit means includes means to bring a heating element to parallel resonance near the center of the VHF band, and matching circuit means is provided which includes series resonator means to produce a series resonance near the center of the VHF band, second series resonator means operable to produce a second series resonance near the center of the VHF band and circuit means for providing two VHF passbands and including two series resonant means, one being series resonant at a predetermined VHF transmit frequency and the other being series resonant at a predetermined VHF receive frequency, such two series resonant means being connected in parallel with each other and connected between the beforementioned second series resonator means and an aerial feeder circuit of a transmit/receive unit.

With respect to the above-described embodiments, a more full and clear explanation will be had by reference

BRIEF DESCRIPTION OF THE DRAWINGS

FIG. 1 shows a simplified block diagram of the Series VHF Matching embodiment;

FIG. 3 shows a simplified block diagram of the Shunt VHF Matching embodiment;

FIG. 5 is a block diagram of the Split Passband Matching embodiment.

DETAILED DESCRIPTION OF THE DRAWINGS

Figure 2:
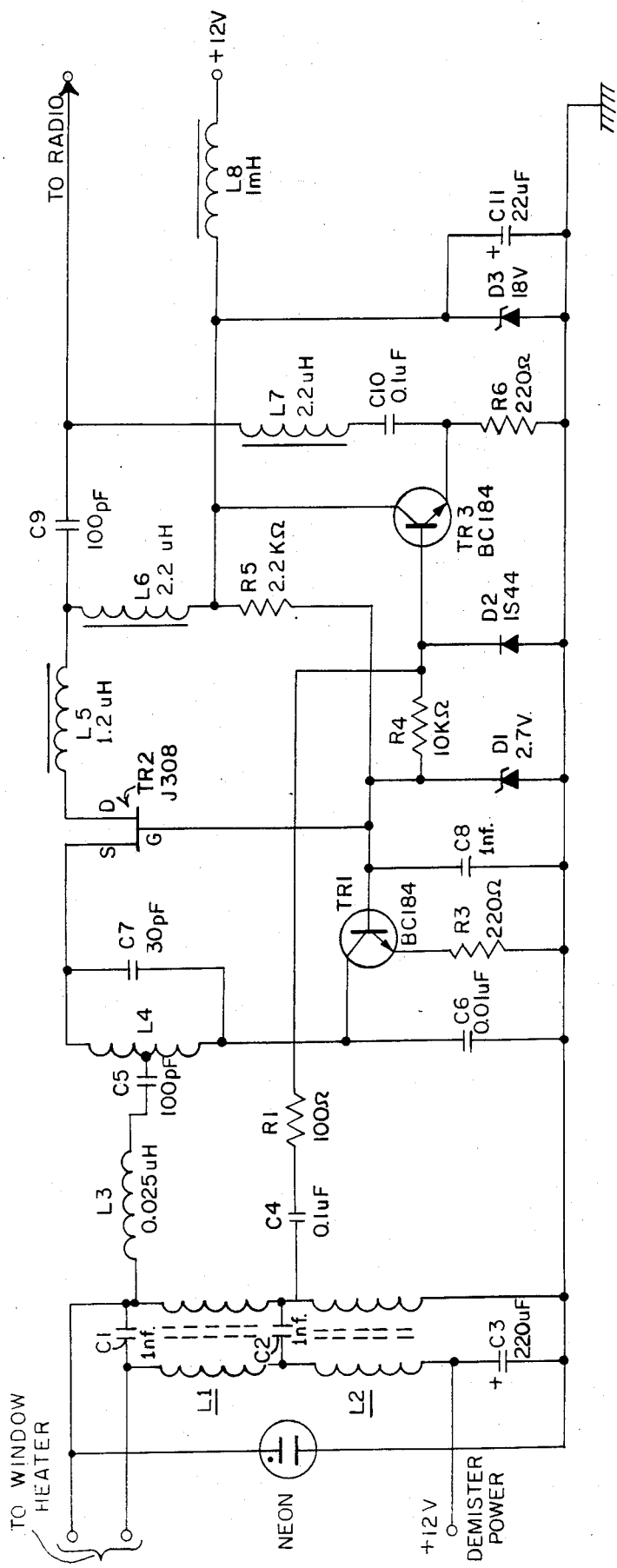
FIG. 2 depicts a detailed schematic diagram of the Series VHF Matching embodiment shown in FIG. 1 in block diagram form.

Referring first to FIG. 1, there is illustrated therein a Series VHF Matching embodiment of the present invention.

For the sake of convenience, the operation of the device depicted in FIGS. 1 and 2 will be described hereinafter in four sections.

Signal frequency input and matching circuit.

A motor vehicle electrically heated window and its heating element (not shown) are isolated from a motor vehicle D.C. power supply means, connectable at the top of C3, at signal frequencies of interest by two bi-filar coil circuit means L1 and L2, which may be bifilar chokes. L1 has a ferrite rod core and is substantially or approximately self-resonant in the VHF range, while L2 comprises a ferrite pot core and provides a high impedance at frequencies in the AM band. Capacitor C3 provides further decoupling of the depicted heater supply line connected at the top of the same. Capacitors C1 and C2 effectively couple the depicted two paths to the terminal leads of a window heater element in parallel at signal frequencies. Components L3, C5, together with the leakage inductance of a tapped coil L4, are arranged to bring the electrically heatable ,window and/or its heating element to series resonance near the center of the VHF band. This series resonant characteristic, together with a parallel-resonant circuit L4-C7, form a near-optimum matching circuit which couples the terminal leads of the heating element to the input of a VHF amplifier circuit means designated TR2. Component C5, connected in series between L3 and tapped coil L4, has a compromise value and operates to effectively block AM signals from the VHF amplifier input and, in this regard, a small value is desired to reduce the capacitance loading of the depicted AM amplifier input, but an excessively low value would increase the reactance slope of the series resonance at VHF and reduce the obtainable bandwidth and performance. The impedance characteristic of L1 is such that VHF signals are effectively blocked, but AM signals are freely passed and are coupled to AM amplifier means TR3 by capacitor C4.

VHF amplifier.

Junction FET TR2 operates in a grounded-gate circuit at signal frequency, bypassing being provided by capacitor C8. The source S of TR2 is directly coupled to a before-mentioned input matching circuit or, as shown, in FIG. 2, to the junction of L4-C7. The drain D is coupled to the RF output circuit line having an aerial terminal (not shown) for connection to an aerial feeder circuit of a radio receiver, by inductor L5, which resonates with the drain capacitance, together with strays, near VHF band-center and provides near optimum matching between the impedance of the cable feeding and connected to a radio receiver, an exemplary impedance being 100 Ω, and the drain of FET TR2. Capacitor C9 blocks the amplifier supply voltage at the drain from the RF signal output line, the amplifier supply voltage being connected to the circuit at the depicted +12 V point at the right-hand side of L8.

AM band amplifier.

Bi-polar transistor TR3 acts as an emitter-follower stage, its base being connected to AM input coupling capacitor C4 via resistor R1 while its output is coupled from its emitter to the RF output line connection to a radio receiver via blocking capacitor C10 and ferrite inductor or choke L7. L7 is self-resonant in the VHF range and effectively prevents the low output impedance of AM band buffer amplifier TR3 from loading the output of VHF band buffer amplifier TR2. The reactance of VHF output capacitor C9 is sufficiently high in the AM range to block AM signals from entering the VHF amplifier drain supply. Resistor R1 serves to prevent high frequency parasitic oscillations in the AM amplifier circuit and R1 could be replaced by two separate resistors connected in series with each other for convenience in a printed circuit board layout of this circuit, the values of such series connected resistors being 47 Ω each.

Bias-supply circuits.

In order to reduce the sensitivity of the operating parameters of the unit depicted in FIGS. 1 and 2, to supply voltage variations and to FET parameter variations, the section of this circuit centered on zener diode D1 and transistor TR1, together with associated resistors R5 and R3, act to provide a stable bias-supply voltage which is connected to the gate of TR2 and to the base of TR3, via R4, with a current source being connected to the source S of TR2. Negligible variations of the operating parameters of the depicted amplifier circuits occur within the normal range of supply voltage variations experienced in a motor vehicle. Noise and interference possibly occurring with the power supply voltage, supplied at the depicted point from a motor vehicle D.C. power supply or other appropriate source, is rejected by filter components L8, a ferrite inductor, and C11. Zener diode D3 provides protection from possible large voltage transients on the supply voltage. Further with respect to filter components L8 and C11, the produced filtered supply voltage therefrom is connected directly to the collector of AM amplifier TR3 and, via VHF ferrite inductor or choke L6, to the drain D of TR2. Two further protective devices are incorporated in the circuit embodiment of FIG. 2, namely, a neon tube element and diode D2, which are connected as shown in order to give protection in the event of static discharge occurring at the heater element of a motor vehicle electrically heatable window unit during any individual or simultaneous operation or function thereof.

With respect to the above-described isolating circuit means of this embodiment, the same could include a mutually coupled circuit means which may comprise a toroidal or U-shaped core wound with two mutually coupled coils of equal but opposite polarity. Other modifications and variations of the depicted isolating circuitry may now become apparent to those skilled in the art and, for example, a mutually coupled coil circuit means could be substituted for bifilar component L2 in a closed magnetic circuit form.

Accordingly, the embodiment depicted in FIGS. 1 and 2 enables a heating element of a motor vehicle electrically heatable window, not designed specifically to be an antenna or aerial and essentially aperiodic and non-resonant at RF frequencies, to become usable as an efficient VHF receiving aerial, and to afford reception of AM signals by an appropriate receiver.

L1 and L2 are depicted as ferrite-cored bifilar coil arrangements, one having a ferrite rod core and the other having a ferrite pot core, as set forth above.

Figure 4:
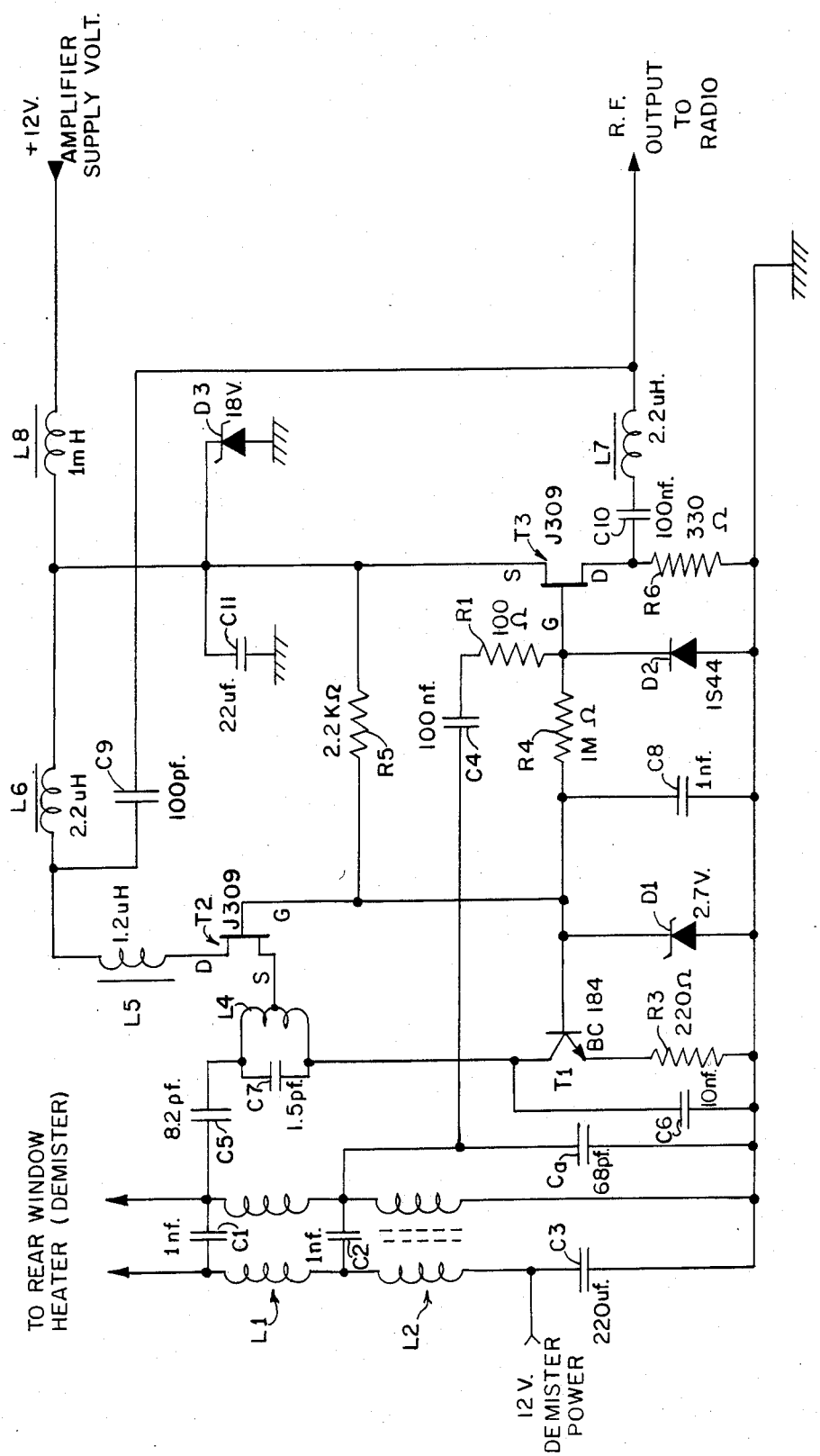
FIG. 4 depicts a detailed schematic diagram of the Shunt VHF Matching embodiment shown in FIG. 3 in block diagram form.

Referring now to FIGS. 3 and 4, a Shunt VHF Matching embodiment is shown therein. A most significant aspect of the Shunt Matching embodiment, as compared to the Series Matching embodiment depicted in FIGS. 1 and 2, is the modified form of the VHF matching circuitry and its connection to and with the isolating circuitry. Depending on the dimensions and detailed arrangement of a motor vehicle electrically heatable window unit, and on the frequency range of a desired VHF band of interest, it may be more convenient to operate a motor vehicle electrically heatable window unit, used as an antenna, as a parallel resonant circuit when incorporating it in the overall matching circuit. In this regard, bifilar inductor L1 is arranged in parallel with the window heater via its terminal leads to achieve resonance in the center of the VHF band.

For the sake of convenience, the operation of the device depicted in FIGS. 3 and 4 will be described hereinafter in four sections.

Signal frequency input and matching circuit.

Depending on the dimensions and detailed arrangement of a motor vehicle electrically heated window unit and its convenience in relation to the pattern of the heater element, i.e., the size, shape, and position of the window unit and its heating element on a specific vehicle, it is, as stated above, more convenient to operate the window unit as a parallel resonant circuit. To this end, the inductance of bifilar coil means L1, together with the reactance of 68 pF capacitor $C_a$, are arranged and connected with each other and the window heater unit to bring the same to resonance near the center of the VHF band. Capacitor $C_a$ is a compromise in its value design since too small a value will result in increased susceptance slope and loss of bandwidth/performance in the VHF band; and, a large value for this capacitor will jeopardize AM performance. For the sake of explanation, it may be stated that the above-described operation of L1 and $C_a$ produce a parallel resonance near VHF band center, which is formed at the heater terminal lead connections. This parallel resonance is coupled by capacitor C5 to a second parallel resonance circuit means L4-C7 in such a way that a broad-band matching characteristic is formed. The actual values of the beforementioned components L1, L4, C5 and C7 may vary depending upon the vehicle model and/or the shape and size of the electrically heatable window unit.

VHF amplifier.

Junction FET T2 operates in a grounded-gate circuit at signal frequency, bypassing of the same being provided by capacitor C8. The source S of T2 is directly coupled to the beforementioned components of the matching circuitry and, in particular, to tapped coil L4. The drain of T2 is coupled to the RF output circuit line, which includes an aerial terminal (not shown), by ferrite inductor L5, which resonates with the drain capacitance, together with strays, near VHF band-center and effectively provides near optimum matching between the impedance of the cable feeding a radio receiver, or the impedance of an aerial feeder circuit of the same, which could be approximately 100 Ω, and the drain of T2. Capacitor C9 blocks the amplifier supply voltage at the drain side of T2 from the RF signal output circuit line, such amplifier supply voltage being inputted as shown in FIG. 4 at a 12 volt connection point to the right-side of L8.

AM band amplifier.

FET T3 acts as a source follower stage, its gate G being connected to input coupling capacitor C4 via resistor R1, while its output, drain side D, is coupled from its Source to the RF output connector line via a blocking capacitor C10 and a ferrite inductor L7, which may be a choke. L7 is self-resonant in the VHF range and effectively prevents the low output impedance of AM amplifier means T3 from loading the output of VHF amplifier means T2. The reactance of VHF output capacitor C9 is sufficiently high in the low frequency AM range to block AM signals from entering the VHF amplifier T2 drain supply. Resistor R1 serves to prevent the occurrence of high frequency parasitic oscillations in the AM amplifier circuit of T3.

Bias-supply circuits.

In order to reduce the sensitivity of the operating parameters of the depicted embodiment to supply voltage variations and to FET parameter variations, the section of the circuit centered on zener diode D1 and bi-polar transistor T1, together with associated resistors R3 and R5, act to provide a stable bias voltage supply, which is connected to the gates of T2 and T3, with a current source being connected to the source S of T2, as shown in FIG. 4. Negligible variations of the operating parameters of the depicted amplifier circuits occur within the normal range of supply voltage variations experienced in a motor vehicle. Noise and interference on the motor vehicle D.C. power supply, or an equivalent amplifier supply voltage means, is rejected by filter components L8 and C11. Zener diode D3 provides protection from possible large voltage transients on the amplifier supply voltage. The filtered amplifier supply voltage is connected, as shown, to AM amplifier means T3, and, via VHF ferrite inductor or choke L6, to the drain D of VHF amplifier T2. A further protective device is incorporated, this being diode D2 to give protection in the event of a static discharge occurring at or within the electrically heated window unit and its heating element, during the operation of the same.

Accordingly, the Shunt Matching embodiment depicted in FIGS. 3 and 4 provides: isolating circuitry effectively coupled in parallel with terminal leads of a heating element of a motor vehicle electrically heatable window and also connected to a motor vehicle D.C. power supply, which circuitry is operable to permit passage of heating current from the power supply to the heating element while isolating or blocking passage of RF signals from the heating element to the power supply; matching circuitry operable to effectively match the impedance of the heating element to an aerial input impedance of an aerial feeder circuit of a receiver device to thereby effect efficient VHF signal reception, such matching circuitry having an input circuit means, $C_a$, operatively connected with isolating circuitry and the heating element and operable with an inductance of the isolating circuitry to bring the heating element to resonance near the center of the VHF band, whereby, the motor vehicle electrically heatable window forms together with such input circuit means a parallel resonant means in the VHF band and becomes usable as an efficient VHF receiving aerial; matching circuitry including a parallel resonance circuit means operable with the beforementioned input circuit means, isolating circuitry and heating element, to form therewith a VHF broad-band matching characteristic circuit; isolating circuitry including bifilar coil circuit means and, as shown, two bifilar coil arrangements, one (L1) being air-cored, and the other (L2) having a ferrite pot core; VHF band amplifier means connected with the beforementioned parallel resonance circuit means; AM band amplifier means to afford reception of AM signals by a receiver device; and, bias-supply circuit means for both the VHF band and AM band amplifier means.

Variations and modifications of the Shunt Matching embodiment will now become apparent to those skilled in the art and, in this regard, the isolating circuitry could include a mutually coupled coil circuit means which may comprise a toroidal or U-shaped core wound with two mutually coupled coils of equal but opposite polarity, which type of device could be substituted for L2, in a closed magnetic circuit.

As set forth above, both the Series and Shunt VHF matching embodiment includes matching circuitry means which operate to effectively match the impedance of a motor vehicle electrically heatable window heating element to an aerial input impedance of an aerial feeder circuit of a radio receiver, to thereby effect efficient VHF signal reception. Further in this regard, the VHF band amplifier means of each of these embodiments also serves to accomplish this purpose in the manner in which the operation of the same has been described hereinabove.

It will be noted that for the sake of clarity in understanding the similarities and differences of the Shunt Matching and Series Matching embodiments, functionally equivalent components of the same have been designated like component enumerations in FIGS. 4 and 2, respectively.

With further regard to FIG. 4, the following is provided to set forth component value designations and descriptions, as designed for the depicted embodiment:
L1: 4+4 turns, 9.5 mm diameter, 1.6 mm wire.
L2: 10½+10½ turns in 30 mm ferrite pop core, 1.4 mm wire, 1.2–1.4 mH.
L4: 4+4 turns, 0.5 mm wire, 6 mm diameter.
L5: 8 turns-resonant at 98 MHz in circuit.
L6: 16 turns-self-resonant at 98 MHz in circuit.
L8: 1 mH, 1 mA choke inductor.

The hereinabove set forth embodiments for Series Matching and Shunt Matching and, in particular, their respective matching circuit arrangements, could, in principle, be used to couple a window heater-antenna to a VHF transmitter/receiver unit, provided that the required overall bandwidth is not excessive. However, it should be recognized that satisfactory/efficient operation of a VHF transmitter may normally demand a better quality of match than that which may be acceptable for a receiver. Thus, depending on the Q-factor of the heater-antenna, and on the separation of the VHF transmit and receive frequencies, it may prove difficult to achieve satisfactory and efficient performance if a matching device or circuitry having a single passband is employed. With further regard to the dependent Q-factor of a motor vehicle electrically heatable window/element-antenna, the hereinbefore set forth Series Matching embodiment may be used for a window element that has a low Q-factor, i.e., below 20, and the disclosed Shunt Matching embodiment may be used with window elements having a high Q-factor over the VHF band, i.e., a Q-factor above 20. In both cases, the embodiments have been designed for a broad-band VHF reception of approximately 88–108 MHz, and an AM broadcast band of 0.15–1.6 MHz.

With respect to the possible difficulty in achieving satisfactory/efficient performance of matching circuitry having a single passband, a third aspect of the invention is provided in FIG. 5 which depicts a Split Passband Matching embodiment.

Referring to FIG. 5, the depicted embodiment provides an isolating and matching device having two passbands which may be designed to give improved performance in the neighborhood of relatively widely separated transmit and receive frequencies, i.e., 82 and 98 MHz, as in the present example. In this embodiment, an isolating circuit means L1, which comprises an air-cored bifilar inductor device, provides a path for the window heater supplied power from a motor vehicle D.C. power supply or demister power supply means, and such isolating circuit means is also designed to bring the heating element of the window heater to parallel resonance near the center of the VHF band. Such bifilar arrangement may also be designed to bring the heating element to parallel resonance near the center or mean frequency of two predetermined transmit and receive frequencies. Capacitor C1, together with lead and stray inductance, forms a series resonator means at such center frequency, as does a second series resonator means comprising L3-C2. The effect of the parallel resonance mentioned above, acting with the latter-mentioned series resonant characteristic, is designed to provide and produces a parallel resonant characteristic in the region of a transmit frequency and also in the region of a receive frequency, which frequencies may be predetermined. Circuits L4-C3 and L5-C4, which are connected in parallel with each other and connected between the second series resonator means L3-C2 and an aerial terminal (not shown) for connection to an aerial feeder circuit of a transmit/receive unit, provide a series resonant characteristic at each of two frequencies, one for transmission and the other for reception. The transmit/receive unit may be a two-way VHF communications transceiver device and, with further regard to circuits L4-C3 and L5-C4, one is designed to be series resonant at a predetermined VHF transmit frequency and the other is designed to be series resonant at a predetermined VHF receive frequency. For example, L4-C3 may be designed to be series resonant at 82 MHz for transmit, and L5-C4 may be designed to be series resonant at 98 MHz for receive, as in the present example. The overall characteristic of this circuit embodiment may be designed to give near-optimum matching over two passbands, one centered on a predetermined transmit frequency and the other centered on a predetermined receive frequency.

Accordingly, the split passband matching embodiment of FIG. 5 provides: isolating circuit means operable to permit passage of heating current from a power supply to a heating element of a motor vehicle electrically heatable window while isolating or blocking passage of RF signals from such heating element to the power supply, and this isolating circuit means is also operable in a matching circuit function to bring the window/heating element to parallel resonance near the center of the VHF band; an isolating and matching device having circuit means for providing two VHF passbands, one centered on a predetermined VHF transmit frequency and the other centered on a predetermined VHF receive frequency, whereby, a motor vehicle electrically heatable window becomes usable as an efficient VHF transmitting and/or receiving aerial; and, matching circuit means including a first series resonator means to produce a series resonance near the center of the VHF band, a second series resonator means connected with said first series resonator means and operable to produce a second series resonance near the center of the VHF band, circuit means for providing two VHF passbands and two series resonant means included in the circuit means for providing two VHF passbands, one being series resonant at a predetermined VHF transmit frequency and the other being series resonant at a predetermined receive frequency; and, wherein the beforementioned parallel resonance acting with the first and/or second series resonance operates to provide a parallel resonance characteristic in the region of a predetermined VHF transmit frequency and in the region of a predetermined VHF receive frequency.

Summarily, the Split Passband Matching embodiment provides an isolating and matching device which is designed to be operable to provide near-optimum matching over two VHF passbands, one for transmission of VHF signals and the other for reception of VHF signals; and, depending on the component and element values which arise when a scheme of this type is applied or designed for a particular window heater-antenna structure, it may be desirable to introduce impedance transformations and other circuit modifications.

It is, of course, to be understood that the invention and the aspects and embodiments of the same presented hereinabove, is not intended to be restricted to the details of such embodiments and many variations and modifications will now become apparent to those skilled in the art. Therefore, the present invention need only be limited, not by the specific disclosure herein, but only by the appended claims.

And, as the invention may be embodied in several forms without departing from the spirit or essential characteristics thereof, the present embodiments are, therefore, illustrative and not restrictive, since the scope of the invention is defined by the appended claims rather than by the description preceding them, and all changes that fall within the metes and bounds of the claims or that form their functional as well as conjointly cooperative equivalents are, therefore, intended to be embraced by those claims.

We claim:

1. An isolating and matching device to enable the heating element of a motor vehicle electrically heatable window, not designed specifically to be an antenna or aerial and essentially aperiodic and non-resonant at VHF frequencies, to be used as a receiving aerial, said device being interconnected between terminal leads of said heating element and an aerial feeder circuit of a receiver and having input leads for connection to a motor vehicle D.C. power supply and an aerial terminal for connection to said aerial feeder circuit, comprising in combination: isolating circuitry coupled with said terminal leads of said heating element and with said motor vehicle D.C. power supply and operable to permit passage of heating current from said power supply to the said heating element while isolating or blocking passage of RF signals from said heating element to the said power supply, and means including matching circuitry means for effectively matching the impedance of said heating element to an aerial input impedance of the said aerial feeder circuit to thereby effect efficient VHF signal reception, said matching circuitry means including input circuit means operatively connected with said isolating circuitry and said heating element for bringing the said heating element to series resonance near the center of the VHF band; whereby, via said isolating and matching device, said motor vehicle electrically heatable window forms together with said input circuit means a series resonance in the VHF band and become usable as an efficient VHF receiving aerial, wherein said isolating circuitry includes bifilar coil circuit means, and wherein said bifilar coil circuit means includes two ferrite-cored bifilar coil arrangements, one having a ferrite rod core and the other having a ferrite pot core.

2. A device according to claim 1, wherein said one bifilar coil arrangement is substantially self-resonant in the VHF range and said other bifilar coil arrangement provides a high impedance at frequencies in the AM band.

3. A device according to claim 2, wherein said matching circuitry means further includes parallel resonant circuit means directly coupled with said input circuit means to form therewith a near-optimum matching circuit.

4. A device according to claim 3, wherein said means including said matching circuitry means includes VHF band amplifier means connected with said parallel resonant circuit means.

5. A device according to claim 4, wherein the said means including said matching circuitry means further includes AM band amplifier means to afford the reception of AM signals by said receiver.

6. A device according to claim 5, wherein the said means including said matching circuitry means further includes bias-supply circuit means for said VHF band and AM band amplifier means.

7. A device according to claim 1, wherein said matching circuitry means further includes parallel resonant circuit means directly coupled with said input circuit means to form therewith a near-optimum matching circuit.

8. A device according to claim 7, wherein said means including said matching circuitry means includes VHF band amplifier means connected with said parallel resonant circuit means.

9. A device according to claim 8, wherein said means including said matching circuitry means further includes AM band amplifier means to afford the reception of AM signals by said receiver.

10. A device according to claim 9, wherein the said means including said matching circuitry means further includes bias-supply circuit means for said VHF band and AM band amplifier means.

11. An isolating and matching device to enable the heating element of a motor vehicle electrically heatable window, not designed specifically to be an antenna or aerial and essentially aperiodic and non-resonant at VHF frequencies, to be used as a receiving aerial, said device being interconnected between terminal leads of said heating element and an aerial feeder circuit of a receiver and having input leads for connection to a motor vehicle D.C. power supply and an aerial terminal for connection to said aerial feeder circuit, comprising in combination: isolating circuitry coupled with said terminal leads of said heating element and with said motor vehicle D.C. power supply and operable to permit passage of heating current from said power supply to the said heating element while isolating or blocking passage of RF signals from said heating element to the said power supply, and means including matching circuitry means for effectively matching the impedance of said heating element to an aerial input impedance of the said aerial feeder circuit to thereby effect efficient VHF signal recepetion, said matching circuitry means including input circuit means operatively connected with said isolating circuitry, said heating element, and a parallel resonant circuit means, and comprising a series connected inductor and capacitor for bringing the said heating element to series resonance near the center of the VHF band, said means including matching circuitry means having a VHF band buffer amplifier means operatively connected to said parallel resonant circuit means; whereby, via said isolating and matching device, said motor vehicle electrically heatable window forms together with said input circuit means a series resonance in the VHF band and becomes usable as an efficient VHF receiving aerial.

12. A device according to claim 11, wherein the said means including said matching circuitry means further includes AM band buffer amplifier means to afford the reception of AM signals by said receiver.

13. A device according to claim 12, wherein the said means including said matching circuitry means further includes bias-supply circuit means for said VHF band and AM band buffer amplifier means.

14. A device according to claim 11, wherein said isolating circuitry includes bifilar coil circuit means.

15. A device according to claim 11, wherein said isolating circuitry includes mutually coupled coil circuit means.

16. A device according to claim 14, wherein said bifilar coil circuit means includes two ferrite-cored bifilar coil arrangements, one having a ferrite rod core and the other having a ferrite pot core.

17. A device according to claim 16, wherein said one bifilar coil arrangement is substantially self-resonant in the VHF range and said other bifilar coil arrangement provides a high impedance at frequencies in the AM band.

18. A device according to claim 15, wherein said mutually coupled coil circuit comprises a toroidal or U-shaped core wound with two mutually coupled coils of equal but opposite polarity.

* * * * *

UNITED STATES PATENT AND TRADEMARK OFFICE
CERTIFICATE OF CORRECTION

PATENT NO. : 4,654,669

DATED : March 31, 1987

INVENTOR(S) : Jerzy J. Kropielnicki, Brian Easter, James D. Last

It is certified that error appears in the above-identified patent and that said Letters Patent is hereby corrected as shown below:

| Column | Line | |
|--------|------|---|
| 10 | 10 | change "togehter" to --together-- |
| 10 | 11 | change "become" to --becomes-- |
| 11 | 9 | change "recepetion" to --reception-- |

Signed and Sealed this

Fourth Day of September, 1990

Attest:

HARRY F. MANBECK, JR.

*Attesting Officer*     *Commissioner of Patents and Trademarks*